US00RE36013E

United States Patent [19]

Lee

[11] E Patent Number: Re. 36,013

[45] Reissued Date of Patent: Dec. 29, 1998

[54] DIFFERENTIAL CHARGE PUMP CIRCUIT WITH HIGH DIFFERENTIAL AND LOW COMMON MODE IMPEDANCE

[75] Inventor: Thomas H. Lee, Cupertino, Calif.

[73] Assignee: Rambus, Inc., Mountain View, Calif.

[21] Appl. No.: 870,638

[22] Filed: Jun. 6, 1997

Related U.S. Patent Documents

Reissue of:

[64] Patent No.: 5,422,529
Issued: Jun. 6, 1995
Appl. No.: 165,398
Filed: Dec. 10, 1993

[51] Int. Cl.[6] ..... H03K 17/56; H03F 3/45

[52] U.S. Cl. ..... 327/536; 327/563; 330/253; 330/257

[58] Field of Search ..... 330/253, 257, 330/258, 306; 327/536, 563

[56] References Cited

U.S. PATENT DOCUMENTS

| | | | |
|---|---|---|---|
| 3,771,063 | 11/1973 | Barrett | 328/134 |
| 4,156,851 | 5/1979 | Winters | 328/155 |
| 4,178,554 | 12/1979 | Sase et al. | 328/133 |
| 4,285,006 | 8/1981 | Kurahashi et al. | 358/35 |
| 4,291,274 | 9/1981 | Suzuki et al. | 328/133 |
| 4,364,082 | 12/1982 | Tonomura et al. | 358/28 |
| 4,479,202 | 10/1984 | Uchida | 365/190 |
| 4,506,175 | 3/1985 | Reitmeier et al. | 307/525 |
| 4,520,321 | 5/1985 | Nakatsugawa et al. | 328/133 |
| 4,623,805 | 11/1986 | Flora et al. | 307/602 |
| 4,635,097 | 1/1987 | Tatami | 358/13 |
| 4,721,904 | 1/1988 | Ozaki et al. | 324/83 |
| 4,751,469 | 6/1988 | Nakagawa et al. | 328/133 |
| 4,868,512 | 9/1989 | Bridgman | 328/133 |
| 4,870,303 | 9/1989 | McGinn | 307/511 |
| 4,893,094 | 1/1990 | Herold et al. | 331/1 A |
| 4,904,948 | 2/1990 | Asami | 328/133 |
| 4,929,916 | 5/1990 | Fukuda | 331/1 A |
| 4,963,817 | 10/1990 | Kohiyama et al. | 324/83 |
| 5,095,233 | 3/1992 | Ashby et al. | 307/603 |
| 5,121,010 | 6/1992 | Hoshizaki et al. | 307/582 |
| 5,128,554 | 7/1992 | Hoshizaki | 307/262 |
| 5,148,113 | 9/1992 | Wight et al. | 328/155 |
| 5,164,838 | 11/1992 | Okuda | 358/326 |
| 5,179,303 | 1/1993 | Searles et al. | 307/603 |
| 5,187,448 | 2/1993 | Brooks et al. | 330/258 |
| 5,220,294 | 6/1993 | Ichikawa | 331/17 |
| 5,223,755 | 6/1993 | Richley | 307/603 |
| 5,248,946 | 9/1993 | Murakami et al. | 330/253 |
| 5,253,042 | 10/1993 | Yasuda | 358/19 |
| 5,253,187 | 10/1993 | Kaneko et al. | 364/560 |
| 5,309,162 | 5/1994 | Uematsu et al. | 342/372 |
| 5,362,995 | 11/1994 | Kubo | 327/65 |
| 5,394,024 | 2/1995 | Buckenmaier et al. | 327/160 |
| 5,422,918 | 6/1995 | Vartti et al. | 375/371 |
| 5,432,480 | 7/1995 | Popescu | 331/11 |
| 5,440,274 | 8/1995 | Bayer | 331/1 A |

FOREIGN PATENT DOCUMENTS

| | | | |
|---|---|---|---|
| 0 490 690 A1 | 6/1992 | European Pat. Off. | H03F 3/45 |
| 0 521 215 A1 | 1/1993 | European Pat. Off. | G11B 20/10 |

OTHER PUBLICATIONS

Patent Abstracts of Japan, vol. 4, No. 67 (E–11) (549) May 20, 1980 & Japan Application, 55 035 516 (Tokyo Shibaura Denki K.K.) Mar. 12, 1980.

*Primary Examiner*—James B. Mullins
*Attorney, Agent, or Firm*—Blakely, Sokoloff, Taylor & Zafman LLP

[57] ABSTRACT

A high gain, low voltage differential amplifier exhibiting extremely low common mode sensitivities includes a load element exhibiting a high differential resistance, but a low common mode resistance. The load element contains a positive differential load resistance and a negative differential load resistance, which offsets the positive differential load resistance. The output common mode level of the differential amplifier is one p-channel source to gate voltage drop below the power supply voltage prohibiting the common mode output voltage from drifting far from an active level. The differential amplifier also has application for use in a differential charge pump circuit. The high differential impedance of the differential amplifier allows the attainment of extremely small leakage, while a low common-mode impedance results in simplified biasing.

15 Claims, 5 Drawing Sheets

DIFFERENTIAL CHARGE PUMP CIRCUIT WITH HIGH DIFFERENTIAL AND LOW COMMON MODE IMPEDANCE

Matter enclosed in heavy brackets [ ] appears in the original patent but forms no part of this reissue specification; matter printed in italics indicates the additions made by reissue.

FIELD OF THE INVENTION

The present invention relates to a differential amplifier having high differential impedance and low common mode impedance.

BACKGROUND OF THE INVENTION.

In general, a differential amplifier, or difference amplifier, receives two signals as inputs, and outputs either the current or voltage difference between the input signals. One problem associated with differential amplifiers is that they exhibit common mode sensitivities. Common mode sensitivities are defined as the dependency of the output common mode voltage on the change in any parameter in the circuit, such as device mismatch. Some differential amplifiers have common mode sensitivities that are of the same order as the differential gain of the amplifier.

FIG. 1a illustrates a typical prior art high gain differential amplifier. The output is coupled from the drains of transistors T1 and T2. As is well known in the art, the incremental differential gain of the circuit illustrated in FIG. 1a is infinitely large if the current source drain loads are perfect, and if transistors T1 and T2 have zero differential output conductance. Although the incremental differential gain is infinite, the differential amplifier also exhibits infinite common mode sensitivity. The infinite common mode sensitivity is a result of the mismatch between the sum of the drain load currents, labeled IDL on FIG. 1a, and the value of the current source at the common source connection. If the drain load currents are not precisely equal, the common mode output voltage approaches the value of either $V_{dd}$ or $V_{ss}$.

To mitigate the problem of common mode sensitivity, a feedback bias circuit may be employed as shown in FIG. 1b. In the circuit of FIG. 1b, the common mode output voltage, labeled Va+Vb, is compared with a reference voltage labeled $V_{ref}$. Any error detected between the desired and actual common mode output levels generates a correction signal that is fed back to control the current source at the common source connection, driving the output voltage to the correct value. Although use of a feedback loop solves the current source biasing problem, the feedback loop generates new problems. For example, the feedback loop introduces complexity to the circuit operation. In addition, a feedback loop inherently exhibits limited bandwidth, thereby placing constraints on the time required to obtain steady state operation when the differential amplifier is powered on and off. The ability to rapidly obtain steady state operation is particularly important in order to extend battery life in portable equipment where it is desirable to activate only those circuits that are in use at a particular moment in time.

Differential amplifiers, when overdriven, also have application for use in charge pump circuits. A charge pump is a circuit, for example, a CMOS circuit, which receives two signals as inputs and generates a voltage across the capacitor indicative of the phase difference between the two input signals. An example of a circuit that uses a charge pump is a phase-locked loop circuit. In such a circuit, a charge pump is used to integrate the phase error between the desired phase and the phase output. A perfectly lossless charge pump provides a theoretically infinite output if there is non-zero phase error.

A perfectly lossless charge pump enables the attainment of theoretically zero phase error (assuming that there are no other error sources), since any finite output can be obtained with a zero value input.

A lossy charge pump, however, requires a non-zero phase error in order to produce a finite output, and hence, a static phase error results. It is therefore desirable to reduce to an absolute minimum any loss in the charge pump.

An idealized prior art technique is shown in the MOS circuit of FIG. 2a. In this circuit, current sources are utilized as high-impedance loads. Transistors T1 and T2 are assumed to be driven by signals that are sufficiently large in amplitude to switch substantially all of the current 2I of the current source alternately through M1 and M2, so that a net current of I or −I flows through the capacitor. This differential circuit requires some means, however, to set the common-mode level of the output voltage (i.e., the average voltage of the drain terminals of T1 and T2).

One method to provide this is through the use of common-mode feedback bias control loop, as shown in the example of FIG. 2b. In the circuit shown in FIG. 2b, the DC value of the output voltage is compared with a reference voltage, and feedback is arranged to adjust the value of the current source to control the common-mode output voltage. However, stability for the common-mode loop is an issue. Additionally, some reference voltage (either explicit or implicit) is needed to set the value of the common-mode output voltage. Furthermore, the biasing circuit consumes substantially additional die area on a relative basis. Finally, in some applications, it is desirable for the common-mode value of the output to lie within fairly narrow bounds, even when the charge pump is turned off. Use of a common-mode loop is impractical in such a case, since, without power, there is no active loop and the value does not lie within narrow bounds.

SUMMARY AND OBJECTS OF THE INVENTION

Therefore, it is an object of the present invention to provide a differential amplifier that possesses low common mode sensitivities.

It is another object of the present invention to provide a s differential amplifier that operates down to low supply voltages.

It is another object of the present invention to provide a differential amplifier possessing a rapid transition from a disabled state to an enabled state.

It is another object of the present invention to provide a differential charge pump circuit that operates with low leakage.

It is another object of the present invention to provide a differential charge pump that operates down to low supply voltages.

Furthermore, it is an object of the present invention to provide a charge pump circuit, which provides well-defined bounds on the common-mode value of the output voltage when powered down.

These and other objects of the present invention are realized in an arrangement including a high gain low voltage differential amplifier exhibiting extremely low common mode sensitivities. The differential amplifier contains a first and second transistor each comprising a first terminal for receiving a supply current, a second terminal for dispensing the supply current, and a third terminal for controlling the amount of supply current flowing from the first terminal to the second terminal. Differential signals are input to the third terminal on the first and second transistors. A power supply, for providing electrical power to the circuit, generates $V_{dd}$ and $V_{ss}$ voltages. A positive differential load resistance is generated and is connected from the power supply to the first terminal of the first transistor and to the first terminal of the second transistor. To offset the positive differential load resistance, a negative differential load resistance is generated and connects the power supply to the first terminal of the second transistor and to the first terminal of the first transistor. The output signal is generated from the first terminal of the first transistor and from the first terminal of the second transistor. Consequently, the output of the differential amplifier exhibits low common-mode impedance so as to reduce common-mode sensitivities.

For operation as a charge pump circuit, the differential amplifier contains at least one capacitor for generating a capacitance across the first terminal of the first transistor and the first terminal of the second transistor. Control signals are input to the third terminals of the first and second transistors so as to permit switching current, in both directions, from the positive differential load resistance and the negative differential load resistance across the capacitance.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A high gain low voltage differential amplifier exhibiting extremely low common mode sensitivities is described. The differential amplifier contains six metal oxide semiconductor field effect transistors (MOSFETs). The high gain and low common mode sensitivity characteristics of the differential amplifier are obtained through a load element. The load element includes a positive differential load resistance and a negative differential load resistance. In one embodiment, the negative and the positive differential load resistances are configured to offset one another. The load element possesses an ideally infinite differential resistance, and low common mode resistance of the order of the reciprocal transconductance of the MOS devices. Because the load element presents a low common mode impedance, the need for common mode feedback is eliminated.

The differential amplifier has application for use in a differential charge pump circuit. The high differential impedance of the differential amplifier allows the attainment of extremely small leakage, while a low common-mode impedance results in simplified biasing.

Figure 1A:
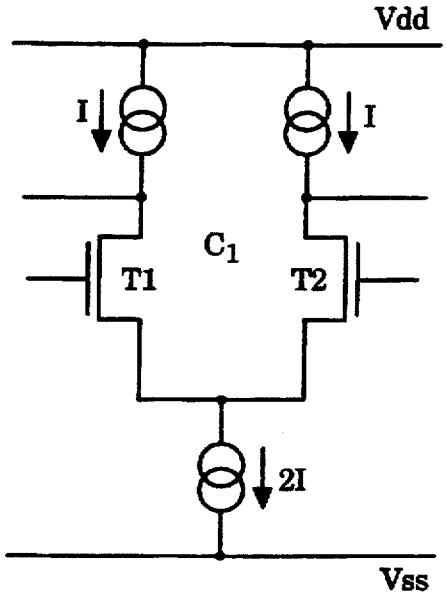
Figure 1a Prior Art
FIG. 1a shows a prior art idealized differential amplifier.
Figure 1B:
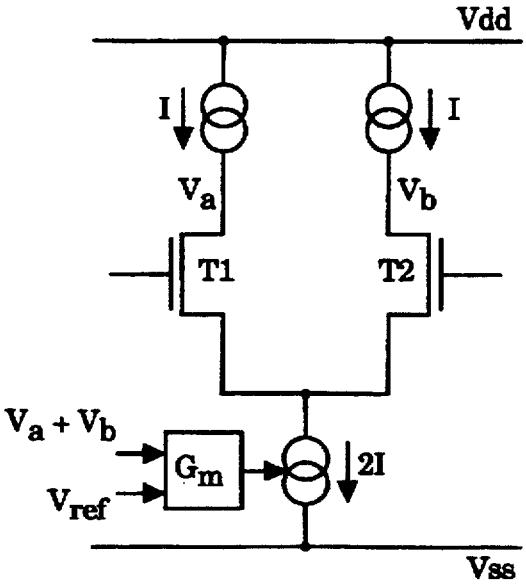
Figure 1b Prior Art
FIG. 1b shows a prior art differential amplifier with common-mode feedback bias.
Figure 2A:
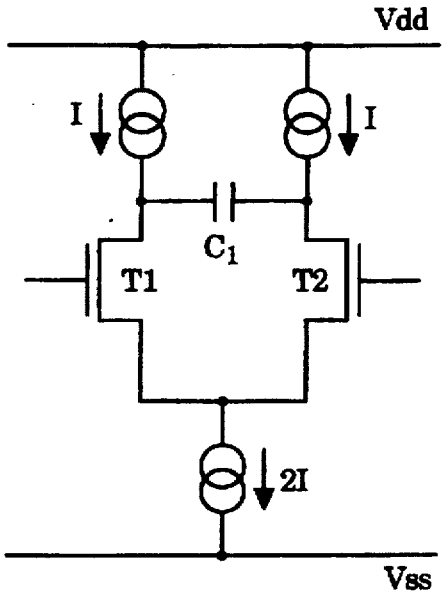
Figure 2a Prior Art
FIG. 2a shows a prior-art differential charge pump.
Figure 2B:
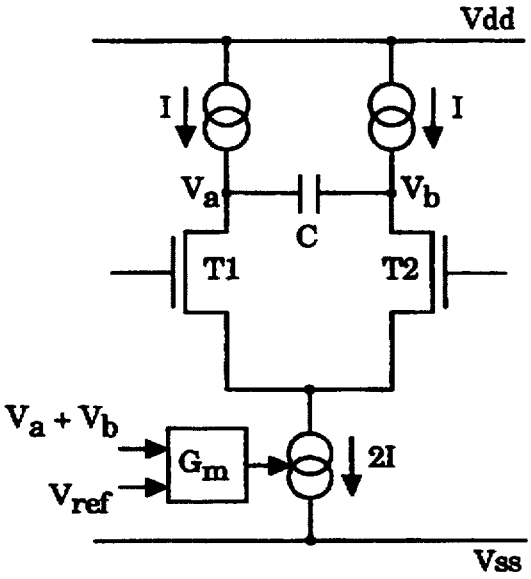
Figure 2b Prior Art
FIG. 2b shows a prior-art differential charge pump with common-mode feedback bias.
Figure 3:
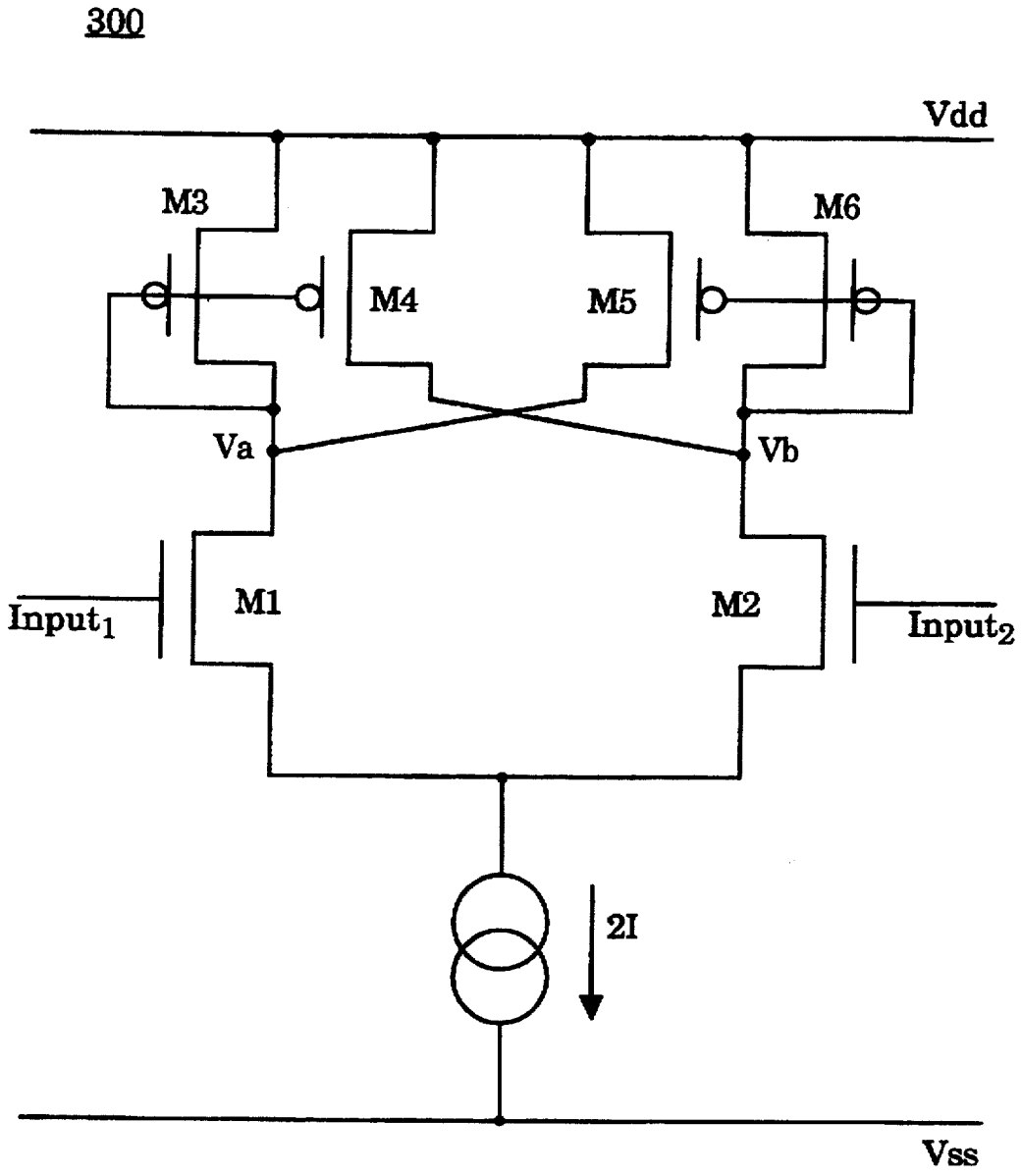
FIG. 3 shows a high gain differential amplifier configured in accordance with the present invention.

FIG. 3 shows a low voltage differential amplifier 300. The low voltage differential amplifier 300 contains six metal oxide semiconductor field effect transistors (MOSFETs). Although embodiments of the invention are described in conjunction with a complementary metal oxide semiconductor (CMOS) configuration, other devices, such as bipolar transistors may be used without deviating from the spirit and scope of the invention. Input signals, labeled $Input_1$ and $Input_2$ on FIG. 3, are input to the gates of transistors M1 and M2, respectively. The differential amplifier 300 is connected to a first power source, having a voltage of $V_{dd}$, and a second power source having a voltage of $V_{ss}$. An output for the differential amplifier 300 is taken from the drains of transistors M1 and M2 labeled $V_a$ and $V_b$ on FIG. 3. The differential amplifier 300 illustrated in FIG. 3 is a high gain differential amplifier exhibiting extremely low common mode sensitivities, on the order of unity. The high gain and low common mode sensitivity characteristics of S the differential amplifier 300 are obtained by coupling a high differential resistance, but a low common mode resistance, from the first power source to the drain of transistors M1 and M2.

The load element of the present invention comprises p-channel MOSFET transistors M3, M4, M5 and M6. The load element couples the first power source to the drains of transistors M1 and M2. The load element possesses an ideally infinite differential resistance, and low common mode resistance of the order of the reciprocal transconductance of the MOS devices. The transistors M3 and M6 are diode connected such that the gates are coupled to the drains of the respective devices. Consequently, transistors M3 and M6 together comprise a very low differential resistance.

The gate of transistor M3 is coupled to the gate of transistor M4, and the gate of transistor M5 is coupled to the gate of transistor M6. Because the gates of transistors M3 and M4 are connected, ideally transistor M4 mirrors the current of transistor M3. The drain of transistor M4 is coupled to the drain of transistor M2 so that the mirrored current through M4 flows through M2. By mirroring the current through transistor M3, which is responsible for the low differential resistance, no differential current is generated.

In effect, transistors M4 and M5 serve as a negative differential resistance. Similarly, transistor M5 mirrors the current of transistor M6. The current flowing through transistor M6 is provided at the drain of transistor M1. Effectively, transistors M3 and M6 constitute a positive differential resistance. Therefore, the high differential resistance is generated because the negative differential resistance, generated by transistors M4 and M5, cancels the positive differential resistance generated by transistors M3 and M6.

Because transistors M3–M6 present a low common mode impedance, the need for common mode feedback is eliminated. The output common mode level of the differential amplifier 300 is one p-channel source to gate voltage drop below the power supply, $V_{dd}$. If the current supplied to the differential amplifier 300 is eliminated, the common mode output voltage cannot drift far from the value retained when the circuit was active. Consequently, power up recovery upon reactivation occurs quickly because the differential amplifier 300 does not utilize common mode feedback bias which requires a feedback loop to settle. In a first embodiment, transistors M3–M6 are constructed substantially identical in size so that the negative differential load resistance cancels the positive differential.

In another embodiment of the differential amplifier of the present invention, transistors M3 and M6 are constructed substantially identical in size, and transistors M4 and M5 are constructed substantially identical in size. Unlike the first embodiment of the present invention, the transistor pair M4 and M5 is mismatched from the transistor pair M3 and M6. By mismatching the transistors comprising both the negative differential resistance and the positive differential resistance, a controlled gain other than infinity is realized. In addition, this embodiment preserves the attribute of low common mode sensitivity. For this embodiment of the differential amplifier, the negative differential resistance of transistor pair M4 and M5 does not precisely cancel the positive differential resistance of transistor M3 and M6, leaving a finite residual differential resistance. The finite residual differential resistance may comprise a positive or a negative resistance, depending on the relative magnitudes of the individual resistances comprising the load elements.

Figure 4:
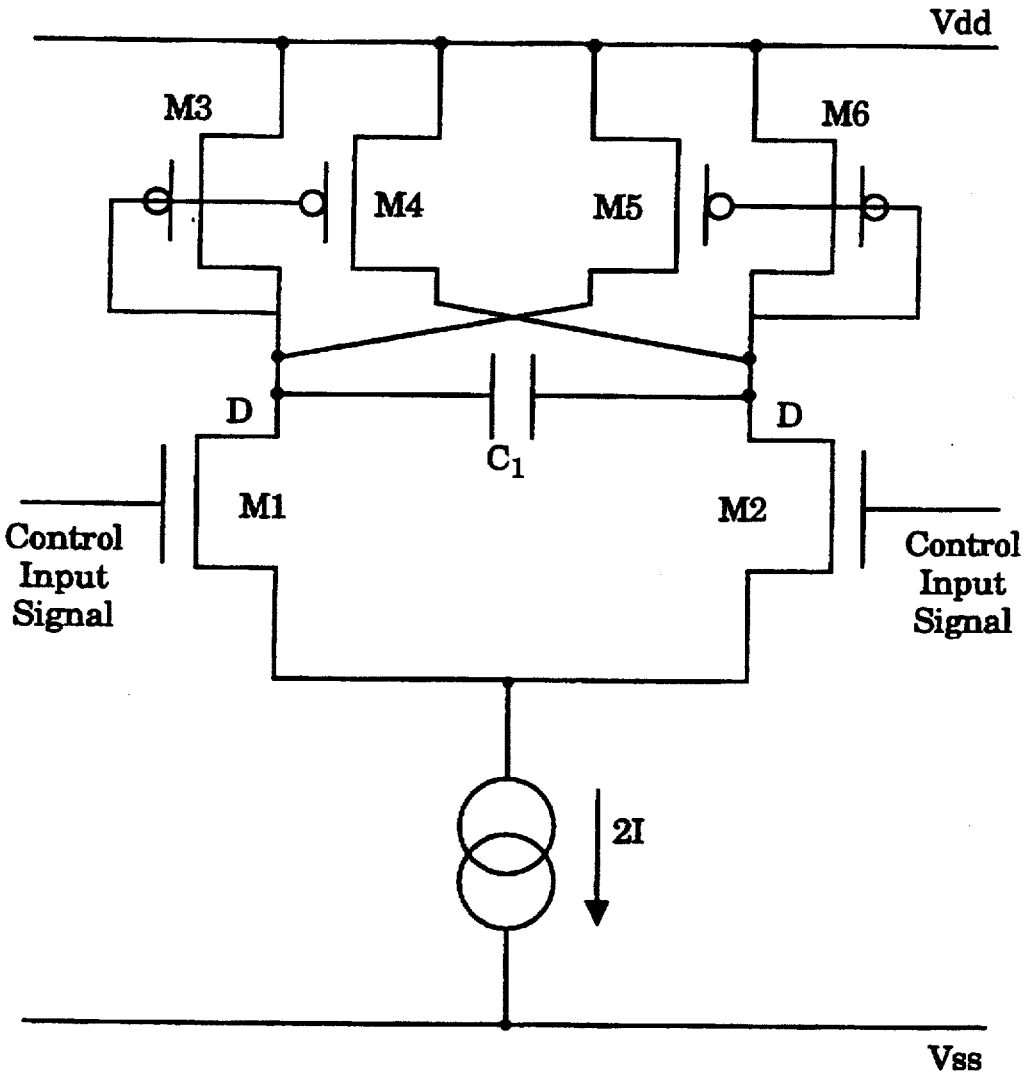
FIG. 4 shows one embodiment of the differential charge pump of the present invention.

The embodiments of the present invention have use in a variety of applications. For example, the differential amplifier has application for use in a differential charge pump circuit. One embodiment of a low leakage CMOS charge pump circuit of the present invention, is illustrated in FIG. 4. For other embodiments, other types of devices may be used.

In the embodiment shown in FIG. 4, the load is formed of a quad of P-channel MOS devices. As explained above in conjunction with the differential amplifier 300, transistors M3 and M6 are diode-connected, and are located in parallel with cross-connected transistors M4 and M5. For use in a charge pump circuit, transistors M3, M4, M5 and M6 are all made to be substantially of the same size. An integration capacitance $C_1$ is shown as a single device connected to the drains of the drive transistors M1 and M2.

The signals driving the gates of drive transistors M1 and M2 are assumed to be large enough in amplitude to switch substantially [all of] the current [2I] *I* of the current source into the integrating capacitance $C_1$.

The diode-connected devices, M3, M6, together present a positive differential resistance. The positive differential resistance by itself provides an undesirable leakage path for the integrating capacitance. To mitigate this leakage, the current through M3, M6 is canceled by the function of transistors M4, M5, which function can be viewed as that of a negative resistance. Thus, transistors M4, M5 cancel out the leakage of M3, M6 in the following manner.

Transistors M3 and M4 comprise a current mirror. Assuming ideal behavior, the two devices carry the same current. Because the drains of devices M3 and M4 are connected to opposite sides of the capacitance, the net contribution by this connection to the differential current is zero. By symmetry, the same reasoning applies to the current mirror formed by transistors M5, M6, so that the net differential resistance presented by transistors M3, M4, M5, M6 is ideally infinite, leaving only finite differential output resistance of the driving pair M1, M2, and the inherent capacitor leakage as differential loss mechanisms.

In practice, however, mismatches in the transistors cause departures from ideal behavior. Hence, it is desirable to choose the effective resistance of the diode-connected devices M3, M6 as high as possible such that any imperfect cancellation by respectively M4, M5, will have a proportionally smaller effect. The effect of finite differential output resistance of M1, M2, is usually negligible, because there is an inherent cascoding effect by M1, M2 on the current source. The charge pump switches [all] the current [2I] *I* into the integrating capacitance by the control input signals in either a positive or negative direction. For example, if M1 is turned on and M2 is turned off, transistor M1 acts as a cascoding device for the current source (which source is assumed to be realized with a transistor or collection of transistors), boosting the effective impedance.

This argument applies symmetrically to the case where M2 is on and M1 is off. Hence, the leakage caused by M1, M2 is generally negligible. Further advantage of the invention is that the common-mode output voltage of the charge pump is simply lower than the positive supply voltage by one source-to-gate voltage of a P-channel device.

Therefore, if the charge pump is ever disabled, for example, by shutting off the current source, recovery is relatively quick because common-mode levels cannot be moved far from their equilibrium active values.

Figure 5:
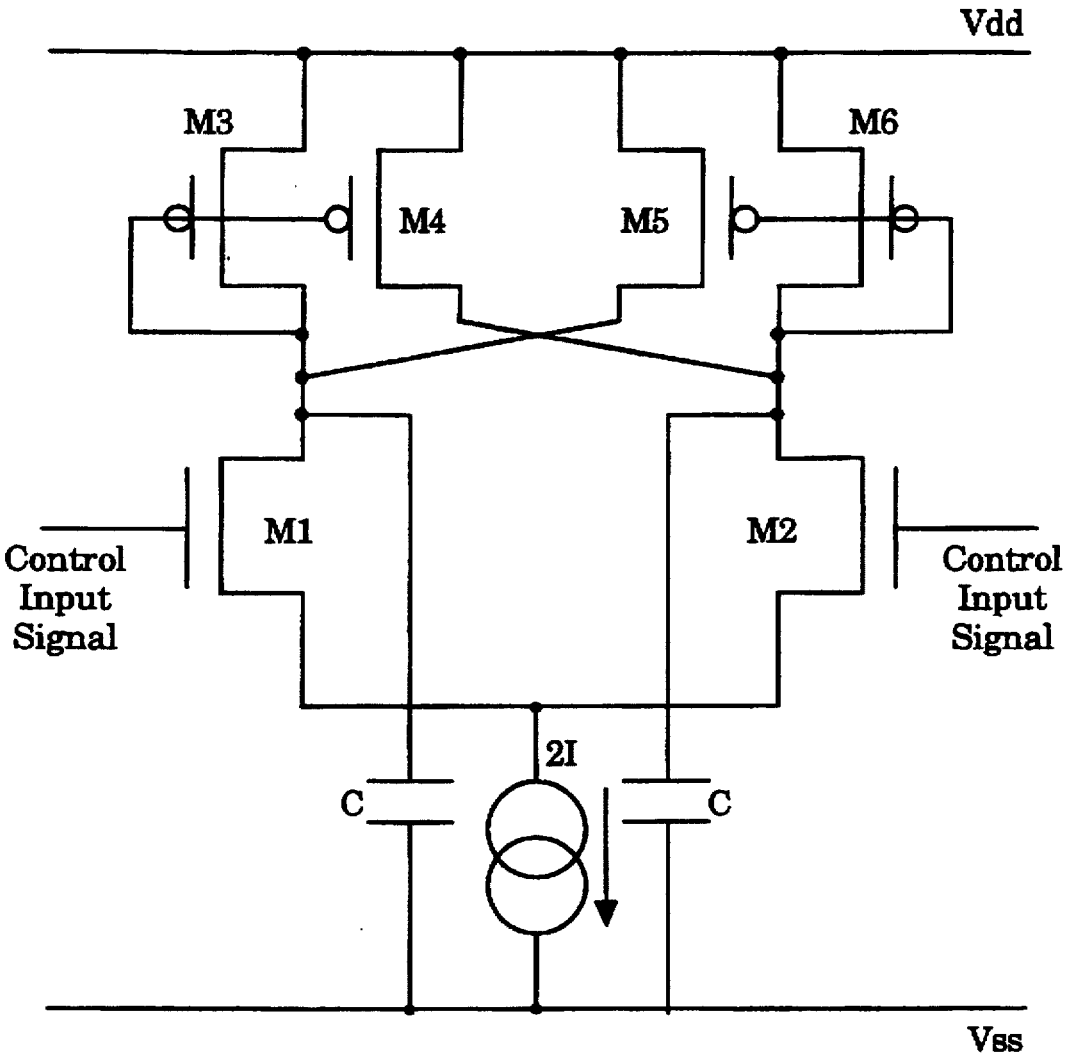
FIG. 5 shows another embodiment of the differential charge pump of the present invention.

FIG. 5 shows a second embodiment of the charge pump circuit of the present invention. For this embodiment, an alternate connection of the integrating capacitance is employed. For some circuits, the most area-efficient capacitance is formed from the gate structure of a MOS transistor. Such capacitors require DC bias that is in excess of approximately one threshold voltage to maximize capacitance and to avoid excessive nonlinearities. In this embodiment, the biasing criteria is satisfied by splitting the capacitor into two equal capacitors and coupling each capacitor to $V_{ss}$. By connecting each capacitor to Vss, this embodiment provides filtering of power supply ($V_{dd}$) noise. Any noise on the positive power supply that couples through the p-channel load devices is bypassed by the capacitors, reducing greatly the amount of the noise passed on to any subsequent stage.

Thus, a differential charge pump that employs a load device that possesses high differential impedance, but a very low common-mode impedance, is described. The high differential impedance allows the attainment of extremely small leakage, while low common-mode impedance results in simplified biasing.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A differential charge pump circuit comprising:

first and second transistors each comprising a first terminal for receiving a supply current, a second terminal for dispensing said supply current, and a third terminal for controlling the amount of supply current flowing from said first terminal to said second terminal, said third terminal on said first and second transistor for receiving control signals comprising large input swings sufficient to switch all of said supply current in either said first transistor or said second transistor;

a power supply for providing electrical power to said circuit;

a load element comprising:

first, second, third, and fourth current sourcing transistors each comprising a first terminal for receiving current and being coupled to said power supply, a second terminal for dispensing current, and a third terminal for controlling the amount of current flowing from said first terminal to said second terminal, said second terminal of said first current sourcing transistor being coupled to said first terminal of said second transistor, and said second terminal of said second current sourcing transistor being coupled to said first terminal of said first transistor;

said third and fourth current sourcing transistors each having said third terminal coupled to said second terminal, said second terminal of said third current sourcing transistor being coupled to said first terminal of said first transistor, and said second terminal of said fourth current sourcing transistors being coupled to said first terminal of said second transistor, and said third terminal in said fourth current sourcing transistor being coupled to said third terminal of said second current sourcing transistor to generate a first current mirror, and said third terminal in said third current sourcing transistor being coupled to said third terminal of said first current sourcing transistor to generate a second current mirror, said third and fourth current sourcing transistors comprising an absolute value being substantially equal to a value of said first and second current sourcing transistors [so that said load element exhibits high differential impedance to prohibit leakage in said first and second transistors]; and at least one capacitor for generating a capacitance across said first terminal of said first transistor and said first terminal of said second transistor, *wherein said load element exhibits high differential impedance to prohibit leakage of the at least one capacitor,* said control signals controlling said third terminals of *said* first and second transistors so as to switch *substantially half of* all of said supply current, in both directions, from said load element across said capacitance.

2. The differential charge pump circuit of claim 1, wherein said first and second transistors comprise n-channel MOSFETs, and said current sourcing transistors comprise p-channel MOSFETs so as to provide an output common mode level at said output terminal being a p-channel MOSFET source to gate voltage below a voltage of said power supply.

3. The differential charge pump circuit of claim 1, wherein said *third and fourth current* sourcing transistors [possesses] *each possess* a high resistance such that any imperfections in said first and second *current sourcing* transistors [results] *result* in a proportionally [small] *smaller* effect.

4. A CMOS differential charge pump circuit comprising:

a first and second n-channel MOSFET transistors each comprising a drain, a source coupled to a biasing current, and a gate for receiving control signals comprising large input swings sufficient to switch all of said biasing current in either said first n-channel MOSFET or said second n-channel MOSFET;

a power supply for providing electrical power to said circuit;

a load element comprising:

a positive differential load resistance coupling said power supply to said drain of said first n-channel MOSFET, and to said drain of said second n-channel MOSFET;

a negative differential load resistance coupling said power supply to said drain of said first n-channel MOSFET, and to said drain of said second n-channel MOSFET, said negative differential load resistance comprising an absolute value being substantially equal to a value of said positive differential resistance [so that said load element exhibits high differential impedance to prohibit leakage in said first and second n-channel MOSFETS]; and at least one capacitor for generating a capacitance across said drain of said first[;] n-channel MOSFET and said drain of said second n-channel MOSFET, *wherein said load element exhibits high differential impedance to prohibit leakage of the at least one capacitor,* said control signals controlling said gates of said first and second n-channel MOSFETs so as to switch *substantially half of* all of said biasing current, in both directions, from said load element across said capacitance.

5. The CMOS differential charge pump circuit of claim 4 [wherein] *further comprising*:

a plurality of p-channel MOSFETS each comprising a source coupled to said [vower] *power* supply, a drain, and a gate[:];

said negative differential load resistance comprises first and second p-channel MOSFETs, said drain of said first p-channel MOSFET being coupled to said drain of said second n-channel MOSFET and said drain of said second p-channel MOSFET being coupled to said drain of said first n-channel MOSFET;

said positive differential load resistance comprises third and fourth p-channel MOSFETs each having said gate coupled to said source, said drain of said third p-channel MOSFET being coupled to said drain of said first n-channel MOSFET, and said drain of said fourth p-channel MOSFETs being coupled to said drain of said second n-channel MOSFET; and said gate in said fourth p-channel MOSFET being coupled to said gate of said second p-channel MOSFET to generate a first current mirror, and said gate in said third p-channel MOSFET being coupled to said gate of said first p-channel MOSFET to generate a second current mirror, wherein an output common mode level at said output terminal being a p-channel MOSFET source to gate voltage below a voltage of said power supply.

6. The CMOS differential charge pump circuit of claim 5, wherein said positive differential load resistance comprising said third and fourth p-channel MOSFETs possesses a high resistance such that any imperfections in said first and second p-channel MOSFETs results in a proportionally small effect.

7. A differential charge pump circuit comprising:

first and second transistors each comprising a first terminal for receiving current, a second terminal, and a third terminal for controlling the amount of biasing current flowing from said first terminal to said second terminal, said third terminal on said first and second transistor receiving control signals comprising large input swings sufficient to switch all said biasing current in either said first transistor or said second transistor for generating a charge pump;

a power supply for providing electrical power to said circuit;

a load element comprising:

a positive differential load resistance coupling said power supply to said first terminal of said first transistor and to said first terminal of said second transistor, and a negative differential load resistance coupling said power supply to said first terminal of said second transistor and to said first terminal of said first transistor, said negative differential load resistance comprising an absolute value being substantially equal to a value of said positive differential resistance [so that said load element exhibits high differential impedance to prohibit leakage in said first and second transistors], and at least one capacitor for generating a capacitance across said first terminal of said first transistor and said first terminal of said second transistor, *wherein said load element exhibits high differential impedance to prohibit leakage of the at least one capacitor,* said control signals controlling said third terminals of *said* first and second transistors so as to switch [all] *a portion* of said biasing current, in both directions, from said load element across said capacitance.

8. The differential charge pump circuit of claim 7 wherein said load element comprises:

a plurality of current sourcing transistors each comprising a first terminal for receiving current and being coupled to said power supply, a second terminal for dispensing current, and a third terminal for controlling the amount of current flowing from said first terminal to said second terminal;

said negative differential load resistance comprising first and second current sourcing transistors, said second terminal of said first current sourcing transistor being coupled to said first terminal of said second transistor, and said second terminal of said second current sourcing transistor being coupled to said [second] *first* terminal of said first transistor;

said positive differential load resistance comprising third and fourth current sourcing transistors each having said third terminal coupled to said second terminal, said second terminal of said third current sourcing transistor being coupled to said first terminal of said first transistor, and said second terminal of said fourth current sourcing transistors being coupled to said first terminal of said second transistor; and said third terminal in said fourth current sourcing transistor being coupled to said third terminal of said second current sourcing transistor to generate a first current mirror, and said third terminal in said third current sourcing transistor being coupled to said third terminal of said first current sourcing transistor to generate a second current mirror.

9. The differential charge pump circuit of claim 8, wherein said first and second transistors comprise n-channel MOSFET transistors, and said plurality of current sourcing transistors comprise p-channel MOSFET transistors so as to provide an output common mode level at said output terminal being a p-channel MOSFET source to gate voltage below a voltage of said power supply.

10. The differential charge pump circuit of claim 8, wherein said third and fourth current sourcing transistors comprise a high resistance so that any imperfection in said first and second current sourcing transistors in cancellation results in a proportionately negligible effect.

11. The differential charge pump circuit of claim 7 wherein at least one capacitor comprise a single capacitor coupled across said first terminal of said first transistor and said first terminal of said second transistor.

12. The differential charge pump circuit of claim 7 wherein at least one capacitor comprise two capacitors, a first capacitor being coupled from said first terminal of said first transistor to ground, and a second capacitor being coupled from said first terminal of said second transistor to ground.

13. A method for generating charge across a capacitor in accordance with control signals, said method comprising the steps of:

providing first and second transistors each comprising a first terminal for receiving a biasing current, a second terminal for dispensing said biasing current, and a third terminal for controlling the amount of biasing current flowing from said first terminal to said second terminal;

inputting, on said third terminal of said first and second transistors, said control signals comprising large input swings sufficient to switch all of said biasing current in either said first transistor or said second transistor;

providing electrical power;

providing a positive differential load resistance;

coupling said electrical power from said positive differential load resistance to said first terminal of said first transistor and to said first terminal of said second transistor;

providing a negative differential load resistance comprising an absolute value being substantially equal to a value of said positive differential resistance [so that said load element exhibits high differential impedance to prohibit leakage in said first and second transistors];

coupling said electrical power from said negative differential load resistance to said first terminal of said second transistor and to said first terminal of said first transistor; and generating a capacitance across said first terminal of said first transistor and said first terminal of said second transistor, *wherein said load element exhibits high differential impedance to prohibit leakage of the at least one capacitor,* said control signals controlling said third terminals of *said* first and second transistors so as to switch *substantially half of* all of said biasing current, in both directions, from said load element across said capacitance.

*14. A differential charge pump circuit comprising:*

*first and second transistors each comprising a first terminal for receiving current, a second terminal, and a third terminal for controlling the amount of biasing current flowing from said first terminal to said second terminal, said third terminal on said first and second transistor receiving control signals comprising large input swings sufficient to switch all said biasing current in either said first transistor or said second transistor;*

*a load element comprising:*

*a positive differential load resistance coupling power to said first terminal of said first transistor and to said first terminal of said second transistor; and*

*a negative differential load resistance coupling power to said first terminal of said second transistor and to said first terminal of said first transistor, said negative differential load resistance comprising an absolute value being substantially equal to a value of said positive differential resistance; and*

*a least one capacitor for generating a capacitance across said first terminal of said first transistor and said first terminal of said second transistor, wherein said load element exhibits high differential impedance to prohibit leakage of the at least one capacitor, said control signals controlling said third terminals of said first and second transistors so as to switch a portion of said biasing current, in both directions, from said load element across said capacitance.*

*15. A method for generating charge across a capacitor in accordance with control signals, said method comprising the steps of:*

*providing first and second transistors each comprising a first terminal for receiving a biasing current, a second terminal for dispensing said biasing current, and a third terminal for controlling the amount of biasing current flowing from said first terminal to said second terminal;*

*inputting, on said third terminal of said first and second transistors, said control signals comprising large input swings sufficient to switch all of said biasing current in either said first transistor or said second transistor;*

*providing a positive differential load resistance;*

*coupling power from said positive differential load resistance to said first terminal of said first transistor and to said first terminal of said second transistor;*

*providing a negative differential load resistance comprising an absolute value being substantially equal to a value of said positive differential resistance;*

*coupling power from said negative differential load resistance to said first terminal of said second transistor and to said first terminal of said first transistor; and*

*generating a capacitance across said first terminal of said first transistor and said first terminal of said second transistor, wherein said load element exhibits high differential impedance to prohibit leakage of the at least one capacitor, said control signals controlling said third terminals of said first and second transistors so as to switch substantially half of all of said biasing current, in both directions, from said load element across said capacitance.*

* * * * *